(12) United States Patent
Shang

(10) Patent No.: US 8,976,922 B2
(45) Date of Patent: Mar. 10, 2015

(54) SHIFT REGISTER UNIT, SHIFTER REGISTER CIRCUIT, ARRAY SUBSTRATE AND DISPLAY DEVICE

(71) Applicant: Boe Technology Group Co., Ltd., Beijing (CN)

(72) Inventor: Guangliang Shang, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 13/704,141

(22) PCT Filed: Oct. 29, 2012

(86) PCT No.: PCT/CN2012/083707
§ 371 (c)(1),
(2) Date: Dec. 13, 2012

(87) PCT Pub. No.: WO2013/097540
PCT Pub. Date: Jul. 4, 2013

(65) Prior Publication Data
US 2014/0056399 A1 Feb. 27, 2014

(30) Foreign Application Priority Data
Dec. 31, 2011 (CN) .......................... 2011 1 0460676

(51) Int. Cl.
*G11C 19/00* (2006.01)
*G11C 19/28* (2006.01)
*G09G 3/36* (2006.01)

(52) U.S. Cl.
CPC .............. *G11C 19/28* (2013.01); *G09G 3/3611* (2013.01); *G09G 2310/0286* (2013.01)

USPC .................................. 377/64; 377/78; 377/79

(58) Field of Classification Search
None
See application file for complete search history.

(56) References Cited

U.S. PATENT DOCUMENTS

| 7,317,780 | B2 * | 1/2008 | Lin et al. .......................... 377/67 |
| 7,953,201 | B2 * | 5/2011 | Tsai et al. ......................... 377/64 |
| 8,284,149 | B2 * | 10/2012 | Yoon et al. ..................... 345/100 |
| 8,548,115 | B2 * | 10/2013 | Shang .............................. 377/64 |
| 2003/0210220 | A1 | 11/2003 | Hebiguchi |
| 2005/0008114 | A1 * | 1/2005 | Moon .............................. 377/64 |

(Continued)

FOREIGN PATENT DOCUMENTS

| CN | 1457059 A | 11/2003 |
| CN | 1797083 A | 7/2006 |

(Continued)

OTHER PUBLICATIONS

International Search Report mailed Jul. 2, 2013; PCT/CN2012/083707.

(Continued)

*Primary Examiner* — Tuan T Lam
(74) *Attorney, Agent, or Firm* — Ladas & Parry LLP

(57) ABSTRACT

The present invention provides a shift register unit, a shift register circuit, an array substrate and a display device, and relates to the area of display manufacturing. The time of the bias working on the de-noising transistor can be reduced without affecting the circuit stability, so that the operational lifespan of the device can be extended. A shift register comprises: a capacitor, a first transistor, a second transistor, a third transistor, a fourth transistor, a fifth transistor, a sixth transistor, a de-noising control model. The present invention is used for manufacturing displays.

10 Claims, 10 Drawing Sheets

(56) References Cited

U.S. PATENT DOCUMENTS

| | | |
|---|---|---|
| 2006/0146979 A1 | 7/2006 | Jang et al. |
| 2007/0019775 A1* | 1/2007 | Tsai et al. ............... 377/64 |
| 2007/0071158 A1* | 3/2007 | Wei et al. ................ 377/64 |
| 2007/0153967 A1* | 7/2007 | Yu .......................... 377/64 |
| 2008/0101529 A1* | 5/2008 | Tobita ..................... 377/64 |
| 2009/0109161 A1 | 4/2009 | Yamamoto et al. |
| 2010/0158188 A1 | 6/2010 | Lee et al. |
| 2010/0259525 A1 | 10/2010 | Ohkawa et al. |
| 2011/0058640 A1 | 3/2011 | Shang et al. |
| 2011/0157112 A1 | 6/2011 | Shibata et al. |
| 2012/0105393 A1* | 5/2012 | Tan et al. ............... 345/204 |
| 2012/0113088 A1* | 5/2012 | Han et al. ............... 345/212 |
| 2012/0262438 A1* | 10/2012 | Shang et al. ........... 345/211 |

FOREIGN PATENT DOCUMENTS

| | | |
|---|---|---|
| CN | 101223606 A | 7/2008 |
| CN | 101295477 A | 10/2008 |
| CN | 101546607 A | 9/2009 |
| CN | 101868833 A | 10/2010 |
| CN | 102012591 A | 4/2011 |
| CN | 102654969 A | 9/2012 |
| JP | 2010-086637 A | 4/2010 |

OTHER PUBLICATIONS

International Report on Patentability dated Jul. 1, 2014; PCT/CN2012/083707.

First Chinese Office Action issuee Mar. 5, 2014; Appln. No. 201110460676.5.

Chinese Patent Grant Notification issued Jun. 6, 2013; Appln. 201110460676.5.

\* cited by examiner

SHIFT REGISTER UNIT, SHIFTER REGISTER CIRCUIT, ARRAY SUBSTRATE AND DISPLAY DEVICE

FIELD OF INVENTION

The present invention relates to a liquid crystal display manufacturing field, in particular to a shift register unit, a shift register circuit, an array substrate and a display device.

BACKGROUND

In recent years, the trend of the development of display appears to be high-integrated and low-cost. One very important technology is the realization of technical mass production of GOA (Gate Driver on Array). A gate switch circuit is integrated on the array substrate of display panel by utilizing the GOA technology, so that the gate driving integrated circuit part can be omitted to reduce the production cost in both aspects of material cost and fabricating process. This kind of gate switch circuit, which is integrated on array substrate by utilizing GOA technology, is also referred to as a GOA circuit or a shift register circuit.

Wherein, the shift register circuit includes several shift register units, each of the shift register units corresponds to one gate line, the output of each of the specific shift register units is connected to one gate line. And the output of one shift register unit connects the input of the next shift register unit. Each shift register unit of a conventional shift register circuit is 12TFT (Thin Film Transistor) 1 Cap (capacitor) configuration. The inventors found that the time of the bias voltage applied on de-noising thin film transistor by the shift register in this configuration is still too long. The duty cycle is about 50%, which is disadvantageous to the operational lifespan of the shift register circuit.

SUMMARY

The embodiments of present invention provide a shift register unit, a shift register circuit, an array substrate and a display device to reduce the time of the bias applied on the de-noising thin film transistor by the shift register, in order to extend the operational lifespan of devices.

To achieve the objects mentioned above, the embodiments of present invention adopt technical solutions, which are:

In one aspect, the invention provides a shift register unit, comprising:

a capacitor with two electrodes, a first electrode is connected to an output;

a first transistor, a gate and the source of which are connected to a signal input respectively and a drain of which is connected to a second electrode of said capacitor;

a second transistor, a gate of which is connected to a reset end, a source of which is connected to the drain of said first transistor and a drain of which is connected to low-level end;

a third transistor, a gate of which is connected to the drain of said first transistor, a source of which is connected to the first clock signal end and a drain of which is connected to said output;

a fourth transistor, a gate of which is connected to said reset end, a source of which is connected to said output and a drain of which is connected to said low-level end;

a fifth transistor, a source of which is connected to the source of said second transistor and a drain of which is connected to said low-level end;

a sixth transistor, a gate of which is connected to said gate of said fifth transistor, a source of which is connected to said the source of said fourth transistor and a drain of which is connected to said the drain of said fourth transistor;

a de-noising control model, a first feedback end of which is connected to said output, a low-level input of which is denoted as a second input being connected to said low-level end, a de-noising control end of which is connected to the gate of said fifth transistor, a high-level input of which is denoted as a third input being connected to said first clock signal end or the high-level end;

wherein said fifth transistor and sixth transistor are switched on when the de-noising control end of said de-noising control model is at high-level and switched off when the de-noising control end of said de-noising control model is at low-level, so that said fifth transistor and sixth transistor are switched on when a noise voltage presents and pull down the noise voltage by the low-level end; said fifth transistor and sixth transistor are switched off when no noise voltage presents and the normal operation of said shift register unit is not affected.

In another aspect, the invention provides a shift register circuit, comprising a plurality of shift register unit mentioned above in series, except for the first shift register unit and the last shift register unit, the output of each of the rest of shift register units is connected to the input of the next shift register unit in adjacent, and the reset end of each of shift register units is connected to the output of the next shift register unit in adjacent.

In still another aspect, the invention provides a array substrate, on which the shift register circuit is formed;

said shift register circuit is a shift register circuit mentioned above.

Still another aspect, a display device is provided, comprising:

a display area, which has a plurality of pixels to display images;

a shift register circuit, which sends a scan signal to said display area; and a data driving circuit, which sends a data signal to said display area.

It is characterized in that, said shift register circuit is a shift register circuit mentioned above.

The embodiments of present invention provide a shift register unit, a shift register circuit, an array substrate and a display device, in order to turn on the de-noising transistor only when noise presents in the output (OUTPUT) and/or the gate of driving TFT (the gate of third transistor) to reduce the time of bias voltage applied on the de-noising transistor, meanwhile, to slow down the shift speed of threshold voltage of the de-noising transistor to further enhance the operational reliability and stability of the shift register, so that the operational lifespan of the shift register is extended.

BRIEF DESCRIPTION OF THE DRAWINGS

To more clearly set forth the embodiments of the present invention and technical solutions of prior arts, a brief introduction to figures needed to employed by the embodiments and prior art are given below, apparently, figures described below are only some embodiments of the present invention, and for an ordinary skilled in the art, other figures can be obtained according to these figures, without spending inventive efforts.

DETAILED DESCRIPTION

The technical solutions of the present invention will be clearly and fully described below with reference to the figures, it is obvious that the embodiments described are only a part of embodiments of the present invention, and they are not all of the embodiments. Based on the embodiments of the present invention, all other embodiments obtained by those skilled in the art without inventive efforts fall in to the scope of the invention.

All transistors adopted in all embodiments of the present invention can be thin film transistors or field effect transistors or any other devices with the same attributes. Since the sources and the drains of transistor employed here are symmetric, the sources and the drains are indifferent. In the embodiments of the invention, in order to distinguish two electrodes besides the gate, one electrode is referred to as the source and the other is referred to as the drain. The upper side of a transistor is the source, the middle is the gate and the under side is the drain in accordance with accompanying figures.

A shift register circuit provided by embodiments of the invention includes a plurality of shift register unit mentioned above in series, except for the first shift register unit and the last shift register unit, the output of each of the rest of shift register units is connected to the input of the next shift register unit in adjacent, and the reset end of each of shift register units is connected to the output of the next shift register unit in adjacent.

Figure 1:
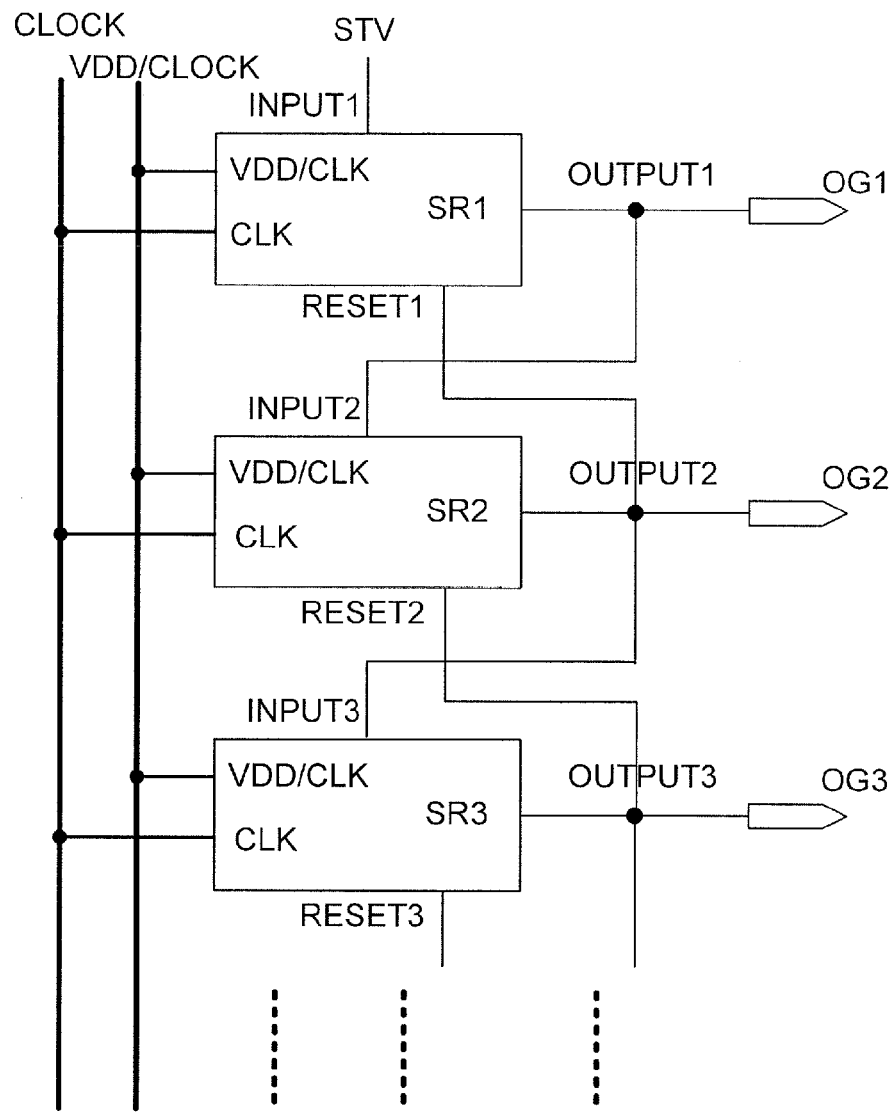
FIG. 1 is a schematic diagram of the configuration of the shift register circuit.

Specifically, the shift register circuit as shown in FIG. 1 comprises several shift register units, wherein the output OUTPUT1 of the shift register unit SR1 is connected to the input INPUT2 of the shift register unit SR2 and is connected to one gate line OG1, the reset end RESET1 of the shift register unit SR1 is connected to output OUTPUT2 of the shift register unit SR2; the output OUTPUT2 of the shift register unit SR2 is connected to the input INPUT3 of the shift register unit SR3 and is connected to one gate line OG2, the reset end RESET2 of the shift register unit SR2 is connected to output OUTPUT3 of the shift register unit SR3; Other shift register units are connected in this way. In additional, every shift register unit has one first clock signal end CLK and one high-level end VDD/CLK input, wherein the first clock signal end CLK is connected to system clock signal, and the high-level end VDD/CLK utilizes the same clock signal as the first clock signal end CLK, or utilizes one high-level VDD input. In this embodiment, the first shift register unit is shift register unit SR1 and the input signal INPUT1 of the shift register unit SR1 is one active pulse signal, optionally as a frame initial signal STV.

It should be explained that, the system clock signal CLOCK is a driving clock signal of two or more shift register units. If necessary, the shift register unit connects the corresponding clock signal, for example, the first clock signal end CLK of the first shift register unit is connected to the first system clock signal, the first clock signal end CLK of the second shift register unit is connected to the second system clock signal, the first clock signal end CLK of the third shift register unit is connected to the first system clock signal, the first clock signal end CLK of the fourth shift register unit is connected to the second system clock signal, and on the following cycles in this manner; or in other connection ways that can cause shift register unit works normally.

Figure 2:
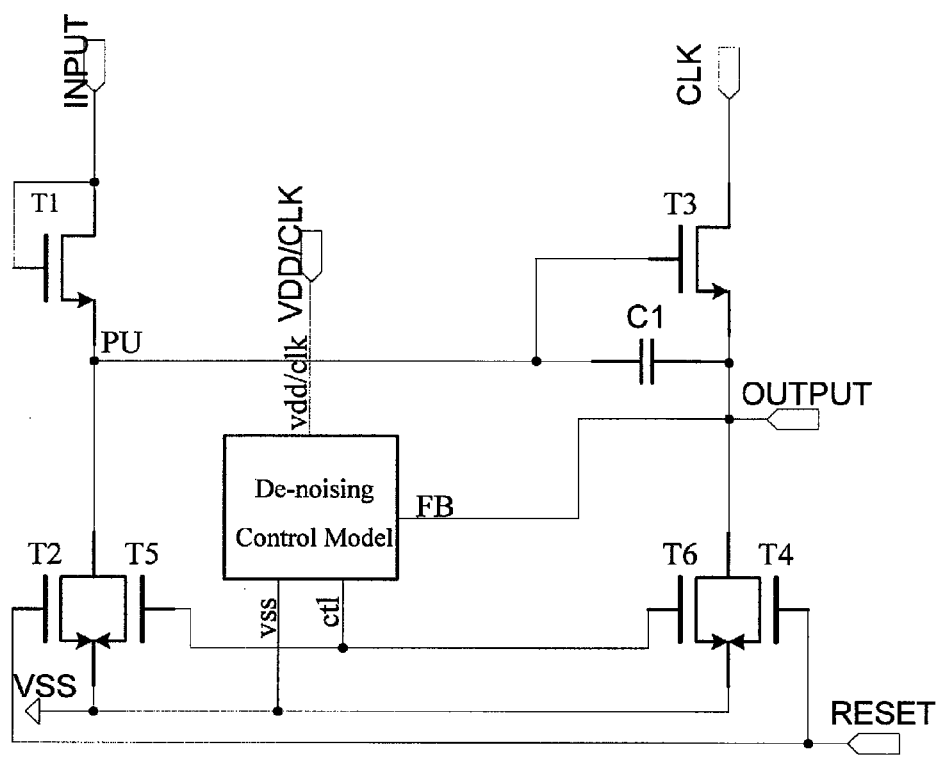
FIG. 2 is a schematic diagram of the configuration of the shift register unit, according to an embodiment of the invention.

FIG. 2 is schematic diagram of the configuration of any shift register unit of above-mentioned shift register circuit provided by embodiments of the invention, comprising: a capacitor C1, a first transistor T1, a second transistor T2, a third transistor T3, a fourth transistor T4, a fifth transistor T5, a sixth transistor T6 and a de-noising control model. And, the signal input of the shift register in FIG. 2 is INPUT, the output is OUTPUT, the reset end is RESET, the first clock signal end is CLK, the high-level end is VDD/CLK (i.e., the third input of de-noising control model), the low-level end VSS, the first feedback end FB. In additional, transistor T3 is driving TFT and Pu is the voltage of node corresponding to the gate of transistor T3.

Embodiments of the invention treat the shift register unit shown in FIG. 2 as the current shift register unit. The connection relationship among its components will be described below in details:

The first end of capacitor C1 is connected to output OUTPUT;

the gate and source of transistor T1 are connected to the signal input INPUT respectively, the drain of transistor T1 is connected to the second end of capacitor C1; since the input of the current shift register unit (in case of not being the first shift register unit) connects the output of the previous shift register unit, and when the previous shift register unit outputs high level, transistor T1 is turned on to save the high level in the capacitor C1;

It should be explained that, the signal input of first shift register unit is connected to the frame initial signal STV, that is, the gate and source of transistor T1 are connected to frame initial signal STV.

The gate of transistor T2 is connected to the reset end RESET of the current shift register unit, the source of transistor T2 is connected to the drain of transistor T1, the drain of transistor T2 is connected to the low-level end VSS of the current shift register unit; here, the reset end RESET is connected to the output signal end of the next shift register unit.

When the next shift register unit outputs high-level, transistor T2 is turned on, the voltage of node PU is pulled down and transistor T3 is turned off.

The gate of transistor T3 is connected to the drain of transistor T1, the source of transistor T3 is connected to the first clock signal end CLK, the drain of transistor T3 is connected to output OUTPUT of the current shift register unit; here, when transistor T3 is turned on and the first clock signal end CLK is high level, the output OUTPUT of the current shift register unit outputs high level, that is, the current shift register unit outputs the gate line scan signal;

The gate of transistor T4 is connected to the reset end RESET of the current shift register unit, the source of transistor T4 is connected to the output OUTPUT of the current shift register unit, the drain of transistor T4 is connected to the low-level end VSS of current shift register unit; here, the reset end RESET of the current shift register unit is connected to the output of the next shift register unit, when the next shift register outputs high level, transistor T4 is turn on, transistor T4 discharges the output OUTPUT of next shift register to low level (i.e., the voltage of the low-level end VSS), that is, the current shift register unit doesn't outputs gate line scan signal;

The source of transistor T5 is connected to the source of transistor T2, the drain of transistor T5 is connected to the low-level end VSS of current shift register unit. Of course, the gate of transistor T5 is the de-noising control end ctl;

The gate of transistor T6 is connected to the gate of transistor T5, that is the de-noising control end ctl. The source of transistor T6 is connected to the source of transistor T4, the drain of transistor T6 is connected to the drain of transistor T4;

De-noising control model, the first feedback end FB of the de-noising control model is connected to the output OUTPUT of the current shift register unit, the low-level input vss (i.e., the second input) of the de-noising control model is connected to the low-level end VSS of the current shift register unit, the de-nosing control end ctl of the de-noising control model is connected to the gate of transistor T5, the high-level input vdd/clk (i.e., the third input) of the de-noising control model is connected to the same clock signal as first clock signal end CLK or high level VDD; wherein T5 and T6 are configured to be switched on when the de-noising control ctl of the de-noising control model is high level, and are configured to be switched off when the de-noising control ctl of the de-noising control model is low level, so that T5 and T6 are switched on when a noise voltage presents and the noise voltage is pulled down by low-level end VSS; that T5 and T6 are switched off and normal operation of the shift register unit will not be affected.

The above-mentioned shift register unit and the shift register circuit cause the de-noising transistor to be turned on only when noise presents, such that reduce the operating time of the bias voltage of de-noising transistor. Therefore, it slows down the threshold voltage shifting speed of de-noising transistor as well in order to enhance the operating reliability and stability of the shift register and extend the operational lifespan of the shift register.

Figure 3:
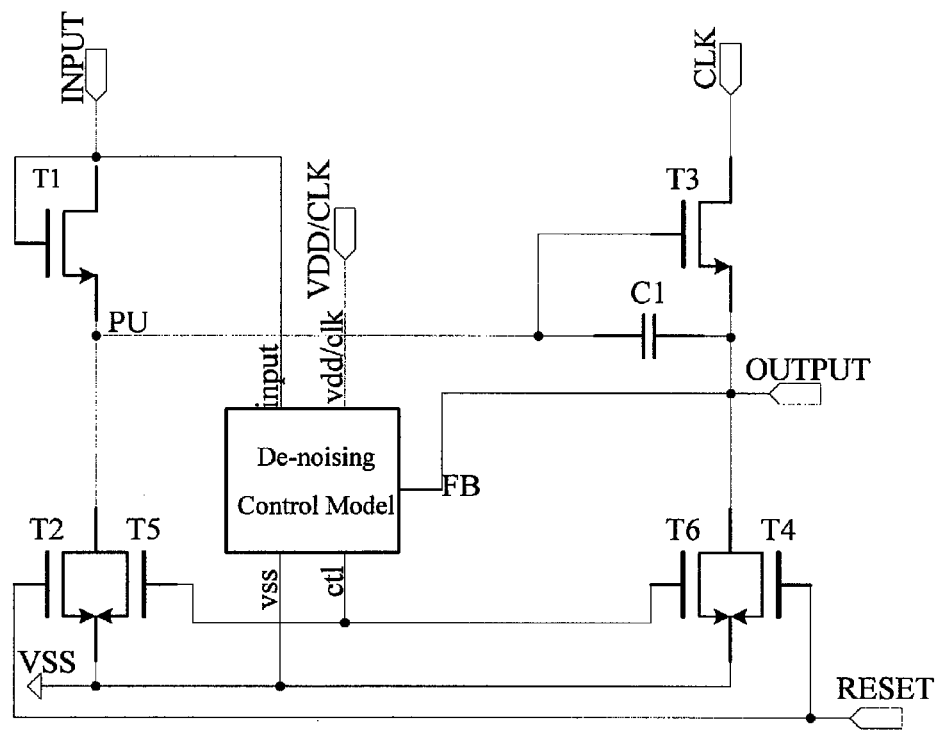
FIG. 3 is a schematic diagram of the configuration of the shift register unit, according to another embodiment of the invention.

Optionally, as shown in FIG. 3, it further comprises: the de-noising control model input (i.e., the first input) of the de-noising control model is connected to the current shift register signal input IUPUT. It ensures that the de-noising control end ctl of the de-noising control model is low-level when the current shift register signal input IUPUT inputs high level, so that the input delay is decreased and the circuit stability is enhanced.

Figure 4:
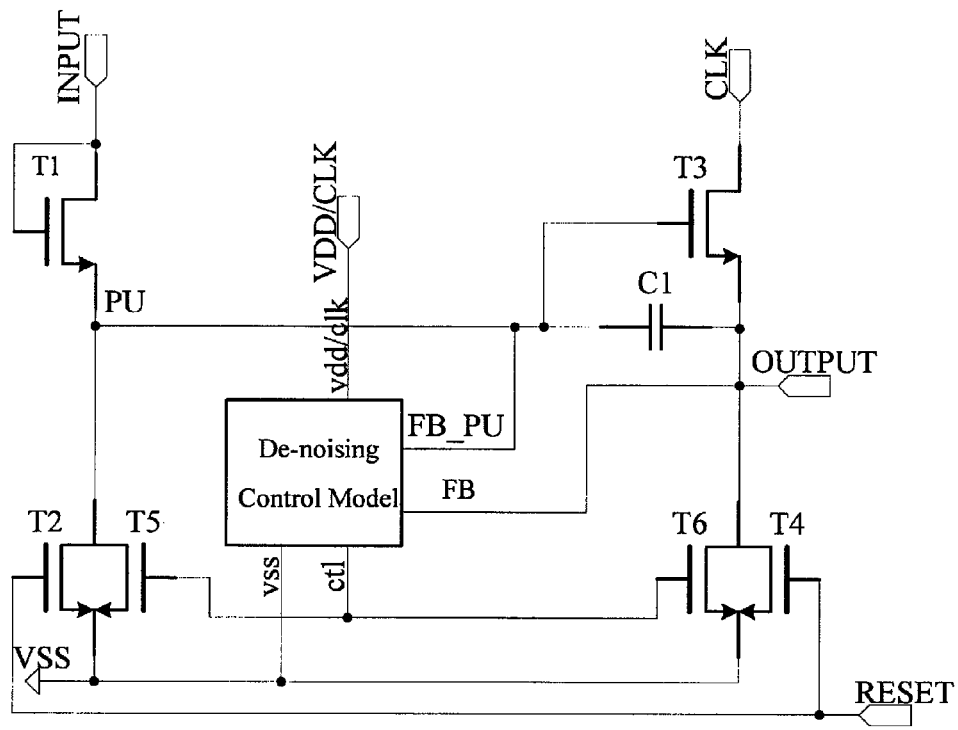
FIG. 4 is a schematic diagram of the configuration of the shift register unit, according to still another embodiment of the invention.

Or optionally, as shown in FIG. 4, it further comprises: the second feedback end FB_PU of the de-noising control model is connected to the drain of transistor T1. Such that it ensures the removal of noise at node PU (i.e. the gate of driving transistor T3) at the same time, so that the de-noising ability is enhanced and the circuit stability is guaranteed.

Figure 5:
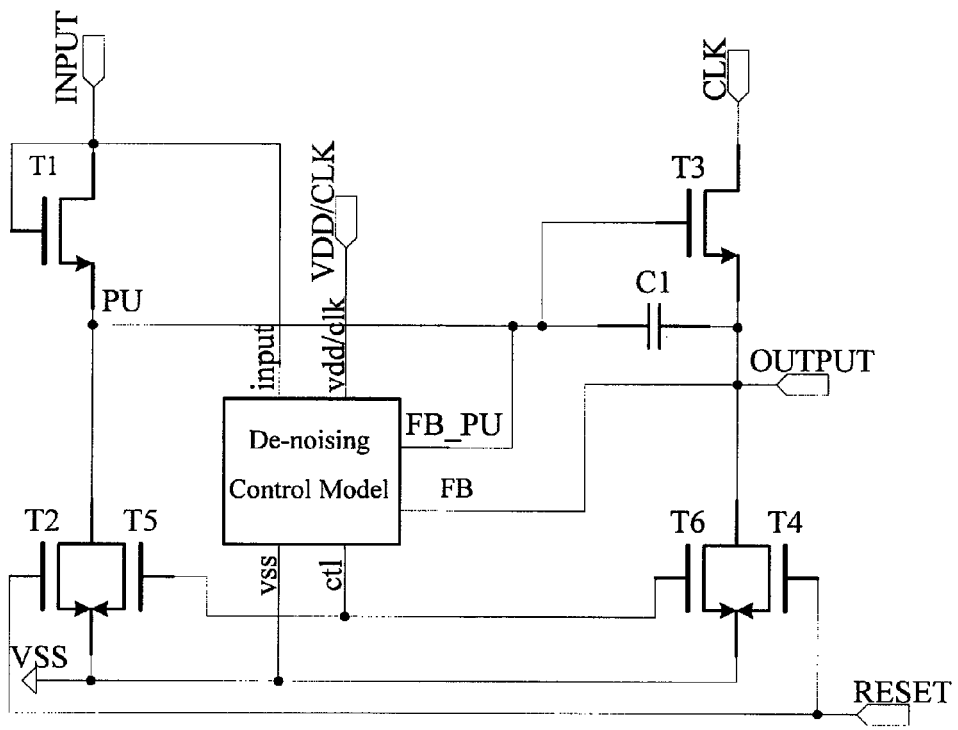
FIG. 5 is a schematic diagram of the configuration of the shift register unit, according to still another embodiment of the invention.

Or optionally, as shown in FIG. 5, it further comprises: the first input input of the de-noising control model is connected to the signal input IUPUT of the current shift register unit and the second feedback end FB_PU is connected to the drain of transistor T1. So that it ensures the de-nosing control end ctl of the de-noising model is low-level when high level is input to the current shift register unit signal input IUPUT, so that the input delay is decreased and the circuit stability is enhanced. Meanwhile, noise at node PU (i.e. the gate of driving transistor T3) can also be removed, so that the de-noising ability is enhanced and the circuit stability is guaranteed.

The electronic devices included in the above-mentioned de-noising control model and the interconnection relationship of various electronic devices will be described in details below.

Figure 6:
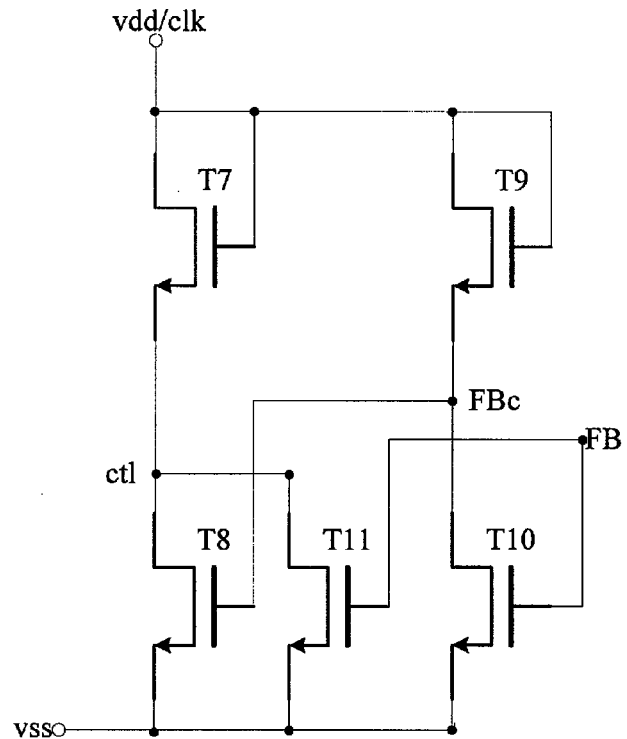
FIG. 6 is a circuit diagram of the de-noising control model provided by the embodiment of FIG. 2.

Optionally, as the de-noising control model circuit diagram provided by the embodiment in FIG. 2 of the present invention shown in FIG. 6, the interconnection relationship of various electronic devices is as follows.

The gate of transistor T7 (i.e., the third input vdd/clk of the de-noising control model) is connected to the same clock signal as the first clock signal end CLK or the high level VDD, the source of transistor T7 is connected to the gate of transistor T7, the drain of transistor T7 (i.e., the de-noising control end ctl of the de-noising control model) is connected to the gate of transistor T5; the source of transistor T8 is connected to the gate of transistor T5, the drain of transistor T8 (i.e., the second input vss of the de-noising control model) is connected to low-level end VSS; the gate of transistor T9 is connected to the gate of transistor T7, the source of transistor T9 is connected to the gate of transistor T9, the drain of transistor T9 is connected to the gate of transistor T8; the gate of transistor T10 (i.e., the first feedback FB of the de-noising control model) is connected to the output OUTPUT, the source of transistor T10 is connected to the drain of transistor T9, the drain of transistor T10 is connected to the low-level end VSS; the gate of transistor T11 is connected to the output OUTPUT, the source of transistor T11 is connected to the gate of transistor T5, the drain of transistor T11 is connected to the low-level end VSS.

Figure 7:
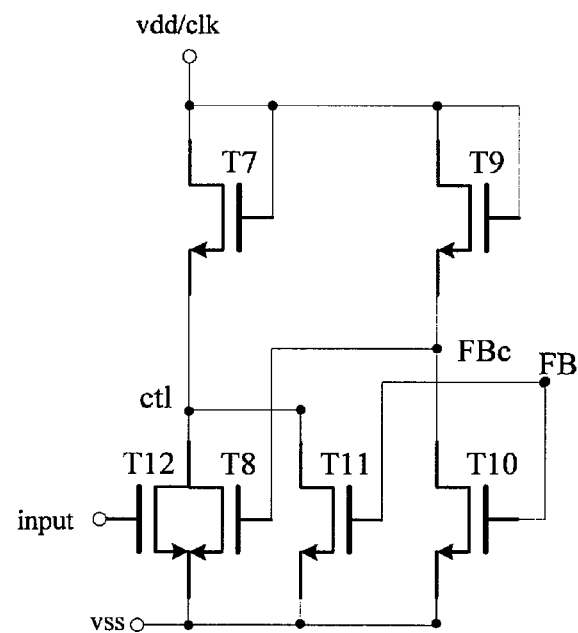
FIG. 7 is a circuit diagram of the de-noising control model provided by the embodiment of FIG. 3.

Or optionally, as the de-noising control model circuit diagram provided by the embodiment in FIG. 3 of the present invention shown in FIG. 7, the interconnection relationship of various electronic devices is as follows.

The gate of transistor T7 (i.e., the third input vdd/clk of the de-noising control model) is connected to the same clock signal as the first clock signal end CLK or the high level VDD, the source of transistor T7 is connected to the gate of transistor T7, the drain of transistor T7 (i.e., the de-noising control ctl of the de-noising control model) is connected to the gate of transistor T5; the source of transistor T8 is connected to the gate of transistor T5, the drain of transistor T8 (i.e., the second input vss of the de-noising control model) is connected to low-level end VSS; the gate of transistor T9 is connected to the gate of transistor T7, the source of transistor T9 is connected to the gate of transistor T9, the drain of transistor T9 is connected to the gate of transistor T8; the gate of transistor T10 (i.e., the first feedback FB of the de-noising control model) is connected to the output OUTPUT, the source of transistor T10 is connected to the drain of transistor T9, the drain of transistor T10 is connected to the low-level end VSS;

the gate of transistor T11 is connected to the output OUTPUT, the source of transistor T11 is connected to the gate of transistor T5, the drain of transistor T11 is connected to the low-level end VSS; the gate of transistor T12 (i.e., the first input of the de-noising control model) is connected to the signal input INPUT, the source of transistor T12 is connected to the gate of transistor T5, the drain of transistor T12 is connected to the low-level end VSS.

Figure 8:
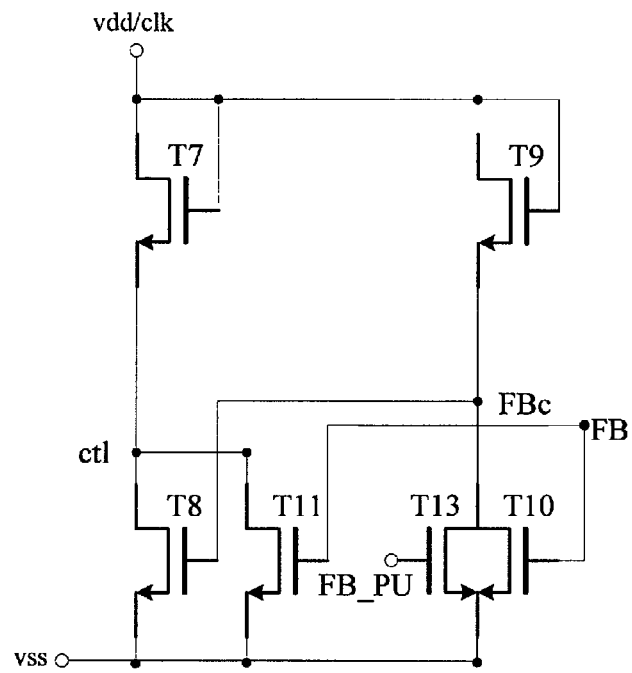
FIG. 8 is a circuit diagram of the de-noising control model provided by the embodiment of FIG. 4.

Or optionally, as the de-noising control model circuit diagram provided by the embodiment in FIG. 4 of the present invention shown in FIG. 8, the interconnection relationship of various electronic devices is as follows.

The gate of transistor T7 (i.e., the third input vdd/clk of the de-noising control model) is connected to the same clock signal as the first clock signal end CLK or the high level VDD, the source of transistor T7 is connected to the gate of transistor T7, the drain of transistor T7 (i.e., the de-noising control ctl of the de-noising control model) is connected to the gate of transistor T5; the source of transistor T8 is connected to the gate of transistor T5, the drain of transistor T8 (i.e., the second input vss of the de-noising control model) is connected to low-level end VSS; the gate of transistor T9 is connected to the gate of transistor T7, the source of transistor T10 is connected to the gate of transistor T9, the drain of transistor T9 is connected to the gate of transistor T8; the gate of transistor T10 (i.e., the first feedback FB of the de-noising control model) is connected to the output OUTPUT, the source of transistor T10 is connected to the drain of transistor T9, the drain of transistor T9 is connected to the low-level end VSS; the gate of transistor T11 is connected to the output OUTPUT, the source of transistor T11 is connected to the gate of transistor T5, the drain of transistor T11 is connected to the low-level end VSS; the gate of transistor T13 (i.e., the second feedback FB_PU of the de-noising control model) is connected to the drain of transistor T1, the source of transistor T13 is connected to the gate of transistor T8, the drain of transistor T13 is connected to the low-level end VSS.

Figure 9:
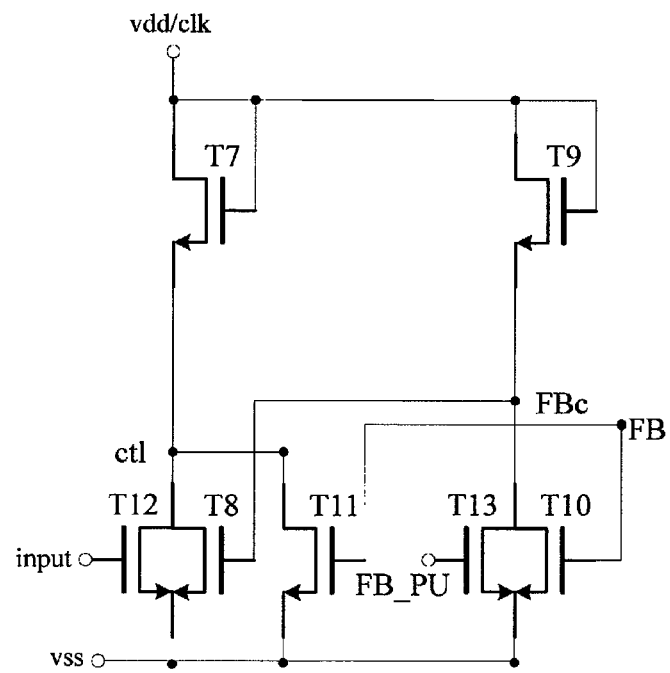
FIG. 9 is a circuit diagram of the de-noising control model provided by the embodiment of FIG. 5.

Or optionally, as the de-noising control model circuit diagram provided by the embodiment in FIG. 5 of the present invention shown in FIG. 9, the interconnection relationship of various electronic devices is as follows.

The gate of transistor T7 (i.e., the third input vdd/clk of the de-noising control model) is connected to the same clock signal as the first clock signal end CLK or the high level VDD, the source of transistor T7 is connected to the gate of transistor T7, the drain of transistor T7 (i.e., the de-noising control ctl of the de-noising control model) is connected to the gate of transistor T5; the source of transistor T8 is connected to the gate of transistor T5, the drain of transistor T8 (i.e., the second input vss of the de-noising control model) is connected to low-level end VSS; the gate of transistor T9 is connected to the gate of transistor T7, the source of transistor T9 is connected to the gate of transistor T9, the drain of transistor T9 is connected to the gate of transistor T8; the gate of transistor T10 (i.e., the first feedback FB of the de-noising control model) is connected to the output OUTPUT, the source of transistor T10 is connected to the drain of transistor T9, the drain of transistor T10 is connected to the low-level end VSS; the gate of transistor T11 is connected to the output OUTPUT, the source of transistor T11 is connected to the gate of transistor T5, the drain of transistor T11 is connected to the low-level end VSS; the gate of transistor T12 (i.e., the first input of the de-noising control model) is connected to the signal input INPUT, the drain of transistor T12 is connected to the low-level VSS; the gate of transistor T13 (i.e., the second feedback FB_PU of the de-noising control model) is connected to the drain of transistor T1, the source of transistor T13 connects the gate of transistor T8, the drain of transistor T13 is connected to the low-level end VSS.

FIG. 10-17 are eight shift register unit circuit diagrams provided in association with FIG. 2-9. The electronic device interconnection relationship of the shift register unit can refer to the interconnection relationship descriptions against FIG. 2-9 above, the explanation of which will be omitted.

For the implementation of the above-mentioned circuit de-noising functions, explanation in association with the shift register unit shown in FIG. 10 will be performed as below.

In the case of normal operations, each shift register unit only outputs high level at one moment and low level otherwise. If the output of one shift register unit exists some high-level outputs (normally the value is small) instead of being absolute low-level as it should be, this is so-called noise voltage. The de-noising function is implemented by the de-noising control model and de-noising transistor T5 and T6.

In the phase of high level being input to current shift register unit signal input, the third input of the de-noising model is connected with high-level VDD. When the output OUTPUT of the current shift register unit is at low-level, T10 and T11 cut off, and T9 is switched on. When the node FBc is at high-level, T8 is switched on. Though T7 is switched on in this case, the width-length ratio (i.e., the width-length ratio of channel) in T7 and T8 can be adjusted (preferably adjust the width-length ratio of the channel of T8 and T7 to be 1:1 to 100:1), such that to cause the node FBc and the de-noising control ctl to be at low-level.

In the phase of the output OUTPUT of the current shift register unit being at high-level, the third input of the de-noising model is connected with high-level VDD. When the output OUTPUT of the current shift register unit is at high-level, T10 and T11 are switched on, and T9 is switched on as well. The width-length ratio (i.e., the width-length ratio of channel) in T7 compared to T11. T9 and T10 can be adjusted (preferably adjust the width-length ratio of the channel of T11 and T7 to be 1:1 to 100:1), such that to cause the node FBc and the de-noising control ctl to be at low-level.

In other phases of might having noise, if noise exists at the output (OUTPUT) of the current shift register, T10 is switched on, the FBc node changes to low level, and T8 is cut off. Now, by adjusting the width-length ratio of channel in T10 and T11, preferably, the width-length ratio of channel in T10 and T11 is set to 1:1 to 100:1 so as to turn on T10 and keep T11 cut off at the same time in the case of the output OUTPUT having voltage output in a non-output state (i.e., noise voltage exists) (here, usually the noise voltage is one or two volts, while dozens of volts in normal output). Since T7 is switched on, ctl becomes at high-level, and de-noising TFT T5 and T6 are switched on, so that the de-noising function is implemented. After the de-noising, T10 cuts off, and since T9 is still on, the FBc becomes at high-level, and at the same time, T8 is switched on too, so ctl becomes at low-level, and T5 and T6 cut off. Thus, the de-noising thin film transistor T5 and T6 being on only when there is noise existing is implemented, so that lower the noise voltage by low-level end VSS and keep T5 and T6 off when there is no noise existing so as to not affect the normal operation of the shift register unit.

Figure 10:
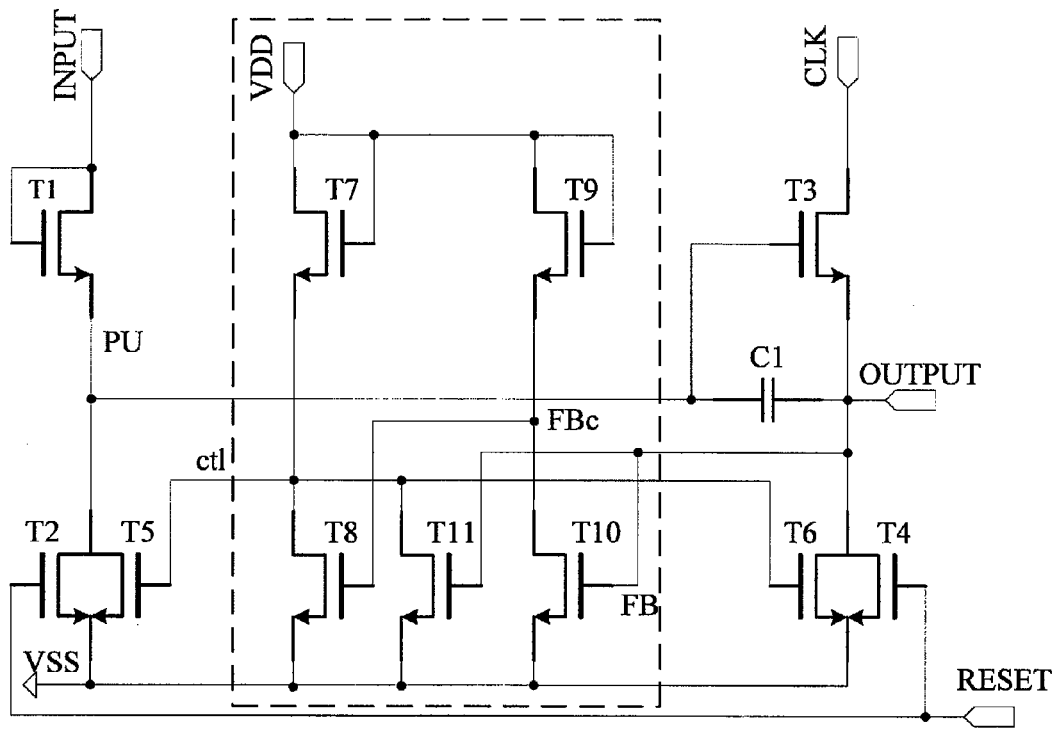
FIG. 10 is a circuit diagram of the shift register unit provided by the embodiment of FIG. 2.
Figure 11:
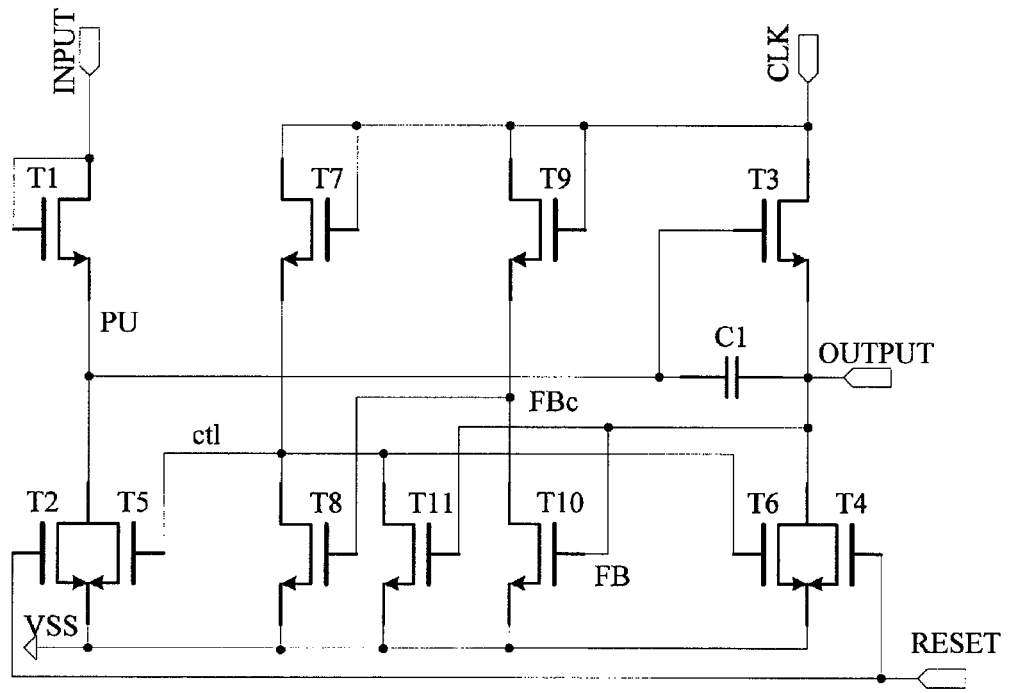
FIG. 11 is another circuit diagram of the shift register unit provided by the embodiment of FIG. 2.

In additional, the shift register unit shown in FIG. 11 is the shift register unit shown in FIG. 10 with the third input of the de-noising control model connected to the clock signal of the first clock signal end and with the input of VDD signal omitted. The operational principle of de-noising is the same but it is advantageous for overall wiring, therefore it reduces the difficulty of designing circuit. It should be explained that FIG. 10 and FIG. 11 include the de-noising control model included in FIG. 6.

Figure 12:
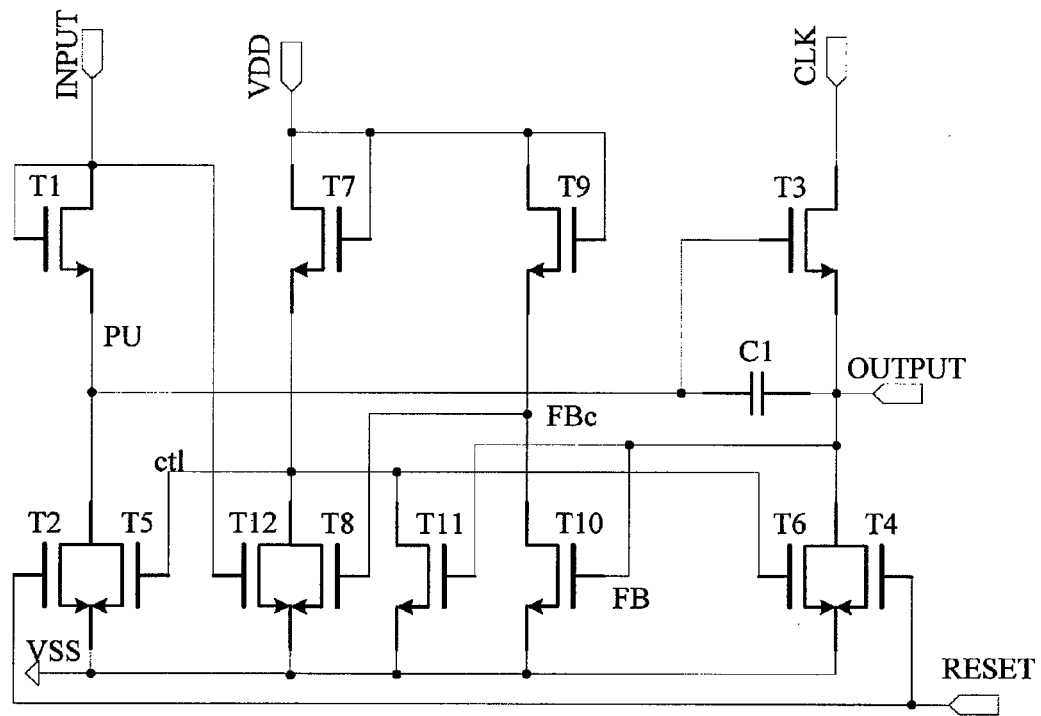
FIG. 12 is a circuit diagram of the shift register unit provided by the embodiment of FIG. 3.
Figure 13:
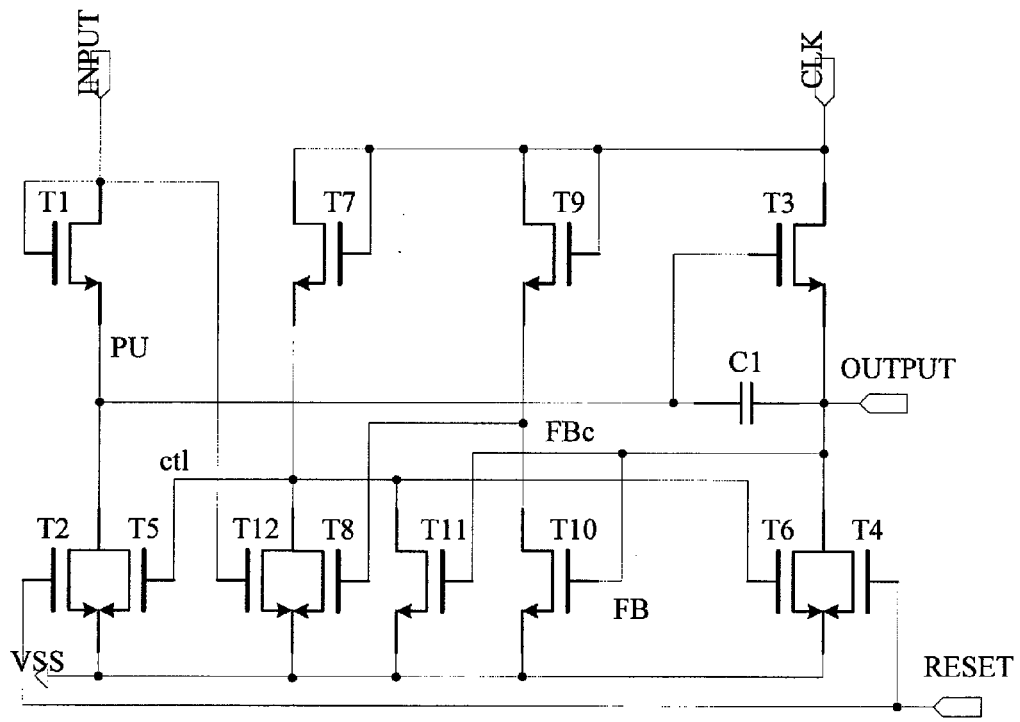
FIG. 13 is another circuit diagram of the shift register unit provided by the embodiment of FIG. 3.

The circuit diagrams of the shift register units shown in FIG. 12 and FIG. 13 are the circuit diagrams of the shift register units with added transistor T12, shown in FIG. 10 and FIG. 11, respectively. That is, FIG. 12 and FIG. 13 include the de-noising control model provided by FIG. 7. Thus, it further ensures that, in the phase of high level being input to the current shift register unit input INPUT, the de-noising control end ctl of the de-noising model is at low level, and it is advantageous for reducing the input delay and enhancing the circuit stability. Since there is no change of the functions of the rest parts of the shift register units shown in FIG. 12 and FIG. 13, no further explanation will be given.

Figure 14:
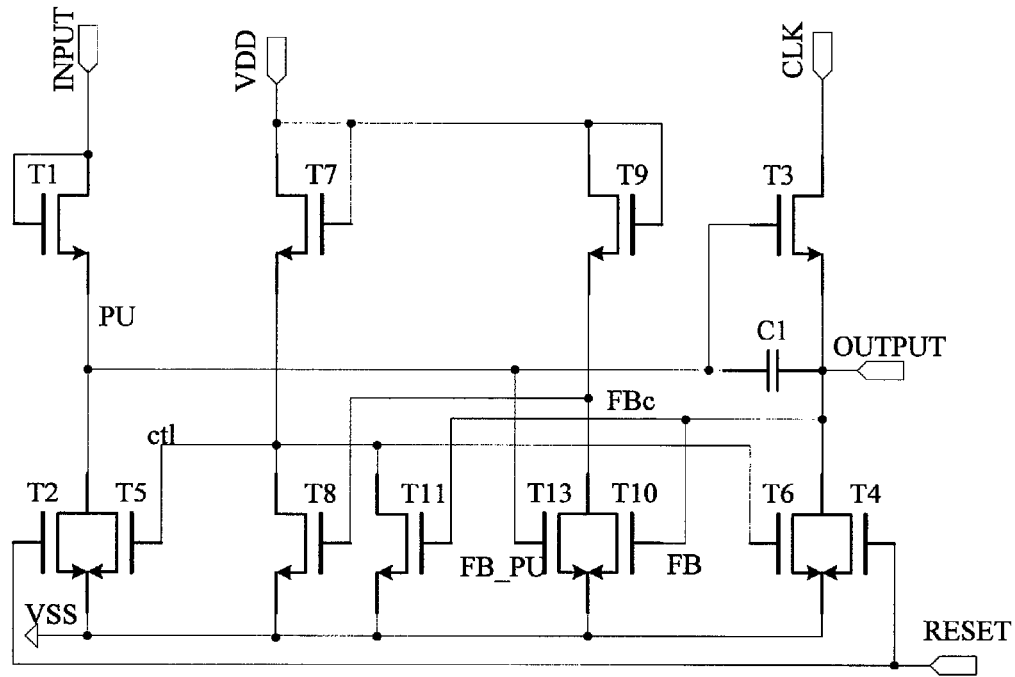
FIG. 14 is a circuit diagram of the shift register unit provided by the embodiment of FIG. 4.
Figure 15:
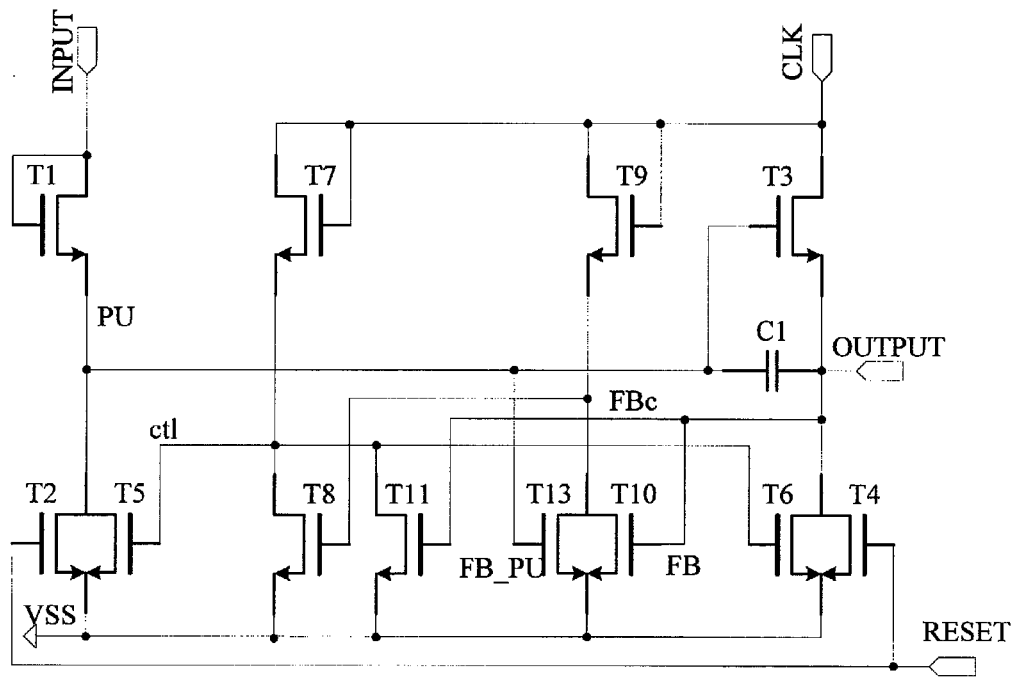
FIG. 15 is another circuit diagram of the shift register unit provided by the embodiment of FIG. 4.

The circuit diagrams of the shift register units shown in FIG. 14 and FIG. 15 are the circuit diagrams of the shift register units with added transistor T13, shown in FIG. 10 and FIG. 11, respectively. That is, FIG. 12 and FIG. 13 include the de-noising control model provided by FIG. 8. Thus, it further ensures that, no matter the current shift register unit output (OUTPUT) or the PU node has noise, it is possible to turn on the noise transistor, so as to reduce the input delay and enhance the circuit stability.

Figure 16:
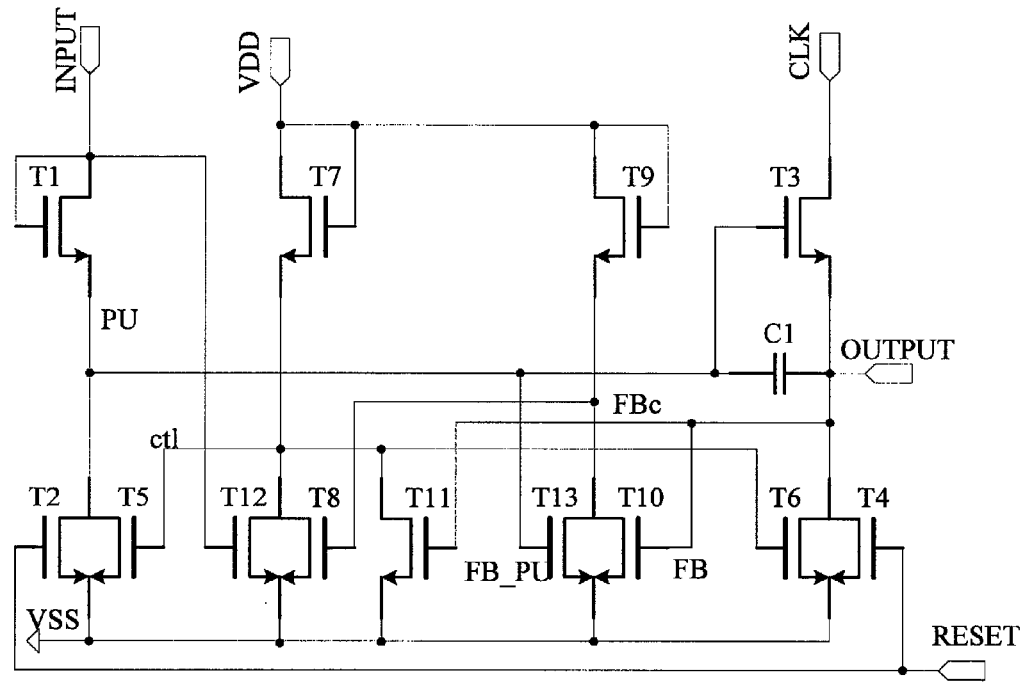
FIG. 16 is a circuit diagram of the shift register unit provided by the embodiment of FIG. 5.
Figure 17:
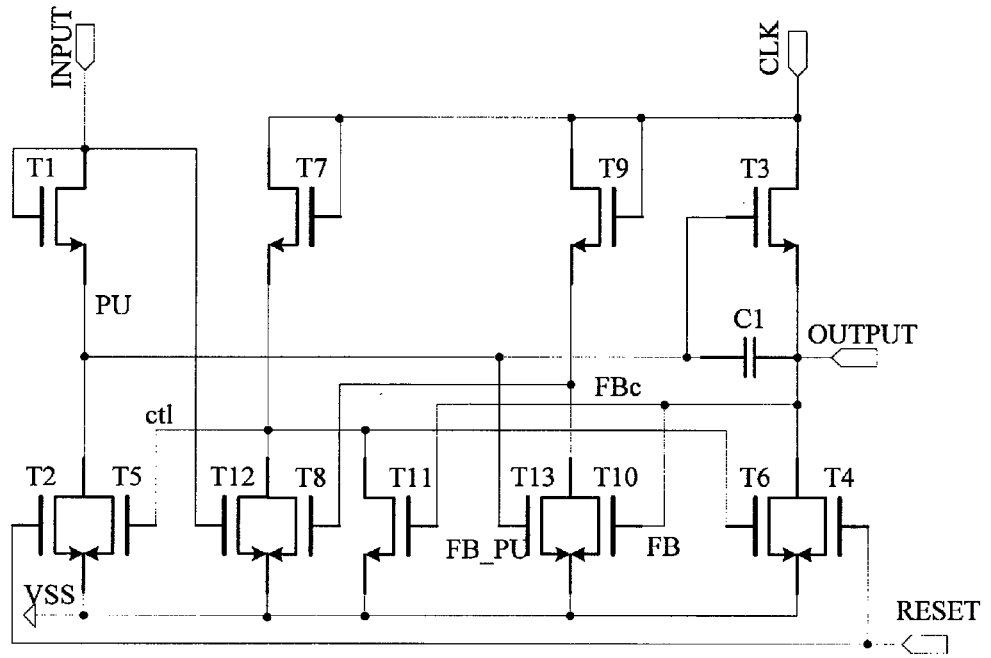
FIG. 17 is another circuit diagram of the shift register unit provided by the embodiment of FIG. 5.

The circuit diagrams of the shift register units shown in FIG. 16 and FIG. 17 are the circuit diagrams of the shift register units with added transistor T13, shown in FIG. 12 and FIG. 13, respectively. That is, FIG. 16 and FIG. 17 include the de-noising control model provided by FIG. 9. Thus, it further ensures that, no matter the current shift register unit output (OUTPUT) or the PU node has noise, it is possible to turn on the noise transistor, so as to reduce the input delay and enhance the circuit stability.

The embodiments of the invention provide the shift register unit and the shift register circuit so as to turn on de-noising transistor only when the output (OUTPUT) and/or the gate of driving TFT (the gate of transistor T3) have noise, such that the applying time of the bias voltage of the de-noising transistor is reduced, and the threshold voltage shifting speed of the de-noising transistor is reduced at the same time. Thus, the operating reliability and stability of the shift register are enhanced, so that the operational lifespan of shift register is extended.

Moreover, the embodiments of the invention provide an array substrate, on which the shift register circuit is formed; and the shift register circuit is the shift register circuit mentioned above.

The embodiments of the invention also provide a display device, such as a display panel, including:

A display area that has a plurality of pixels for displaying the image; a shift register circuit sending scanning signal to the display area; and data driving circuit sending data signal to the display area. Wherein, the shift register circuit is the shift register circuit mentioned above. In additional, the display device can be display devices such as E-paper, cell phone, television, digital frame and so on.

All those described above is only the embodiments of the invention. However, the scope of the invention is not limited therein. In the technical scope disclosed in the invention, any variation or replacement that occurs easily to those skilled in the art falls within the scope of the invention. Thus, the protection scope of the invention is defined with the protection scope claimed by the claims.

What is claimed is:

1. A shift register unit, wherein, comprising:
   a capacitor having two electrodes, wherein a first electrode is connected to an output;
   a first transistor, a gate and a source of which are connected to a signal input, respectively, a drain of which is connected to a second electrode of said capacitor;
   a second transistor, a gate of which is connected to a reset end, a source of which is connected to the drain of said first transistor, a drain of which is connected to a low-level end;
   a third transistor, a gate of which is connected to the drain of said first transistor, a source of which is connected to a first clock signal input, a drain of which is connected to said output;
   a fourth transistor, a gate of which is connected to said reset end, a source of which is connected to said output, a drain of which is connected to said low-level end;
   a fifth transistor, a source of which is connected to the source of said second transistor, a drain of which is connected to said low-level end;
   a sixth transistor, a gate of which is connected to the gate of said fifth transistor, a source of which is connected to the source of said fourth transistor, a drain of which is connected to the drain of said fourth transistor;
   a de-noising model, a first feedback end of which is connected to said output, a low-level input of which is denoted as a second input being connected to said low-level end, a de-noising control end of which is connected to the gate of said fifth transistor, a high-level input of which is denoted as a third input being connected to said first dock signal end or high-level end;
   wherein said de-noising control model comprises:
   a seventh transistor, a gate of which is connected to said first clock signal end or high-level end, a source of which is connected to the gate of said seventh transistor, a drain of which is connected to the gate of said fifth transistor;
   an eighth transistor, a source of which is connected to the gate of said fifth transistor, a drain of which is connected to said low-level end;
   a ninth transistor, a gate of which is connected to the gate of said seventh transistor, a source of which is connected to the gate of said ninth transistor, a drain of which is connected to the gate of said eighth transistor;
   a tenth transistor, a gate of which is connected to said output, a source of which is connected to said the drain of the ninth transistor, a drain of which is connected to said low-level end; and
   an eleventh transistor, a gate of which is connected to said output, a source of which is connected to the gate of said fifth transistor, a drain of which is connected to said low-level end;
   wherein said fifth transistor and sixth transistor are switched on when the de-noising control end of said de-noising control model is at high-level and switched off when the de-noising control end of said de-noising control model is at low-level, so that said fifth transistor and sixth transistor are switched on when a noise voltage presents and pull down the noise voltage by the low-level end, and said fifth transistor and sixth transistor are switched of when no noise voltage presents and normal operation of said shift register unit is not affected.

2. The shift register unit of claim 1, wherein, further comprising:
   an first input of said de-noising control model is connected to said signal input.

3. The shift register unit of claim 1, wherein, further comprising: a second feedback end of said de-noising control model is connected to the drain of said first transistor.

4. The shift register unit of claim 1, wherein,
   when said signal input is at high-level, the drain of said seventh transistor is at low-level; when said output is at high-level, the drain of said seventh transistor is at low-level and the drain of said ninth transistor is at low-level;

meanwhile, when there is voltage output in the non-output state, said tenth transistor is turned on and said eleventh transistor remains off at the same time.

5. The shift register unit of claim 4, wherein, said de-noising control model further comprises:
a twelfth transistor, a gate of which is connected to said signal input, a source of which is connected to the gate of said fifth transistor, a drain of which is connected to said low-level end.

6. The shift register unit of claim 4, wherein, said de-noising control model also includes:
A thirteenth transistor, a gate of which is connected to the drain of said first transistor, a source of which is connected to the gate of said eighth transistor, a drain of which is connected to said low-level end.

7. The shift register unit of claim 4, wherein,
the width-length ratio of said eighth transistor and seventh transistor is set to 1:1-100:1, so that when said signal input is at high-level, the drain of said seventh transistor is at low-level;
the width-length ratio of said eleventh transistor and seventh transistor is set to 1:1-100:1, so that when said output is at high-level, the drain of said seventh transistor is at low-level, meanwhile the width-length ratio of said tenth transistor and ninth transistor is 1:1-100:1, so that when said output is at high-level, the drain of said ninth transistor is at low-level;
the width-length ratio of said tenth transistor and eleventh transistor is set to 1:1-100:1, so that when there is voltage output in the non-output state, said tenth transistor is turned on and said eleventh transistor remains off at the same time.

8. A shift register circuit, wherein, comprising, a plurality of said shift register units as claimed in claim 1, in series, and except for the first register unit and the last register unit,
the output of each shift register unit of the rest is connected to the input of the next shift register unit in adjacent; the reset end of each shift register unit is connected to the output of the next shift register unit in adjacent.

9. An array substrate, wherein, there is shift register circuit formed on said array substrate;
said shift register circuit is the shift register circuit of claim 8.

10. A display device, including:
a display area, having a plurality of pixels to display images;
a shift register circuit, sending the scanning signal to said display area; and
a data driving circuit, sending data signal to said display area;
wherein, said shift register circuit is the shift register circuit of claim 8.

* * * * *